United States Patent
Kamikawa et al.

(10) Patent No.: US 6,413,355 B1
(45) Date of Patent: *Jul. 2, 2002

(54) APPARATUS FOR AND METHOD OF CLEANING OBJECTS TO BE PROCESSED

(75) Inventors: Yuji Kamikawa, Koshi-machi; Satoshi Nakashima, Kikusui-machi; Kinya Ueno, Nirasaki, all of (JP)

(73) Assignee: Tokyo Electron Limited, Tokyo-To (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/936,121

(22) Filed: Sep. 24, 1997

(30) Foreign Application Priority Data

Sep. 27, 1996 (JP) .............................................. 8-256637

(51) Int. Cl.⁷ ................................................. C23F 1/02
(52) U.S. Cl. .......................... 156/345; 438/745; 438/747
(58) Field of Search ................................. 438/745, 747, 438/706, 710; 134/1.2, 1.3, 95.2, 11, 22.1 L; 156/345; 118/723 I, 723 R

(56) References Cited

U.S. PATENT DOCUMENTS

| | | | | |
|---|---|---|---|---|
| 5,186,192 A | * | 2/1993 | Netsu et al. ................. | 134/68 |
| 5,265,632 A | * | 11/1993 | Nishi ........................... | 134/133 |
| 5,369,891 A | * | 2/1994 | Kamikawa .................... | 34/78 |
| 5,443,540 A | * | 8/1995 | Kamikawa .................... | 34/471 |
| 5,520,744 A | * | 5/1996 | Fujikawa et al. ............. | 134/11 |
| 5,634,978 A | * | 6/1997 | Mohindra et al. ............. | 134/2 |
| 6,045,624 A | * | 4/2000 | Kamikawa et al. ........... | 134/30 |

FOREIGN PATENT DOCUMENTS

| | | | |
|---|---|---|---|
| JP | 81230 | 3/1989 | |
| JP | 64-81230 | 3/1989 | |
| JP | 1-300525 | 12/1989 | |
| JP | 2-1565631 | 6/1990 | |
| JP | 0370134 | * 3/1991 | |
| JP | 03070134 | * 3/1991 | ......... H01L/21/304 |
| JP | 3-236232 | 10/1991 | |
| JP | 3-246940 | 11/1991 | |
| JP | 4-251930 | 9/1992 | |
| JP | 6-77203 | 3/1994 | |
| JP | 6-283496 | 10/1994 | |
| JP | 326073 | 11/1994 | |
| JP | 6-326073 | 11/1994 | |
| JP | 7-130699 | 5/1995 | |
| JP | 7-130722 | 5/1995 | |
| JP | 7-153734 | 6/1995 | |
| JP | 7-335601 | 12/1995 | |
| JP | 8-78381 | 3/1996 | |
| JP | 9-283489 | 10/1997 | |

OTHER PUBLICATIONS (Translation of Office Action) Notification of Reasons for Rejection.

* cited by examiner

Primary Examiner—Benjamin L. Utech
Assistant Examiner—Lan Vinh
(74) Attorney, Agent, or Firm—Smith, Gambrell & Russell, LLP

(57) ABSTRACT

A cleaning apparatus and a cleaning method for cleaning an object are provided. In the cleaning apparatus, a drying chamber 42 and a cleaning bath 41 are separated from each other up and down, respectively. Thus, a space in the drying chamber 42 can be insulated from a space of the cleaning bath 41 through a slide door 72. In the cleaning method, a drying process and a cleaning process are carried out separately on condition that the space in the drying chamber 42 is insulated from the space of the cleaning bath 41 through the slide door 72. Consequently, there is no possibility that, during the drying process, the object is subjected to a bad influence from a chemical treatment.

15 Claims, 18 Drawing Sheets

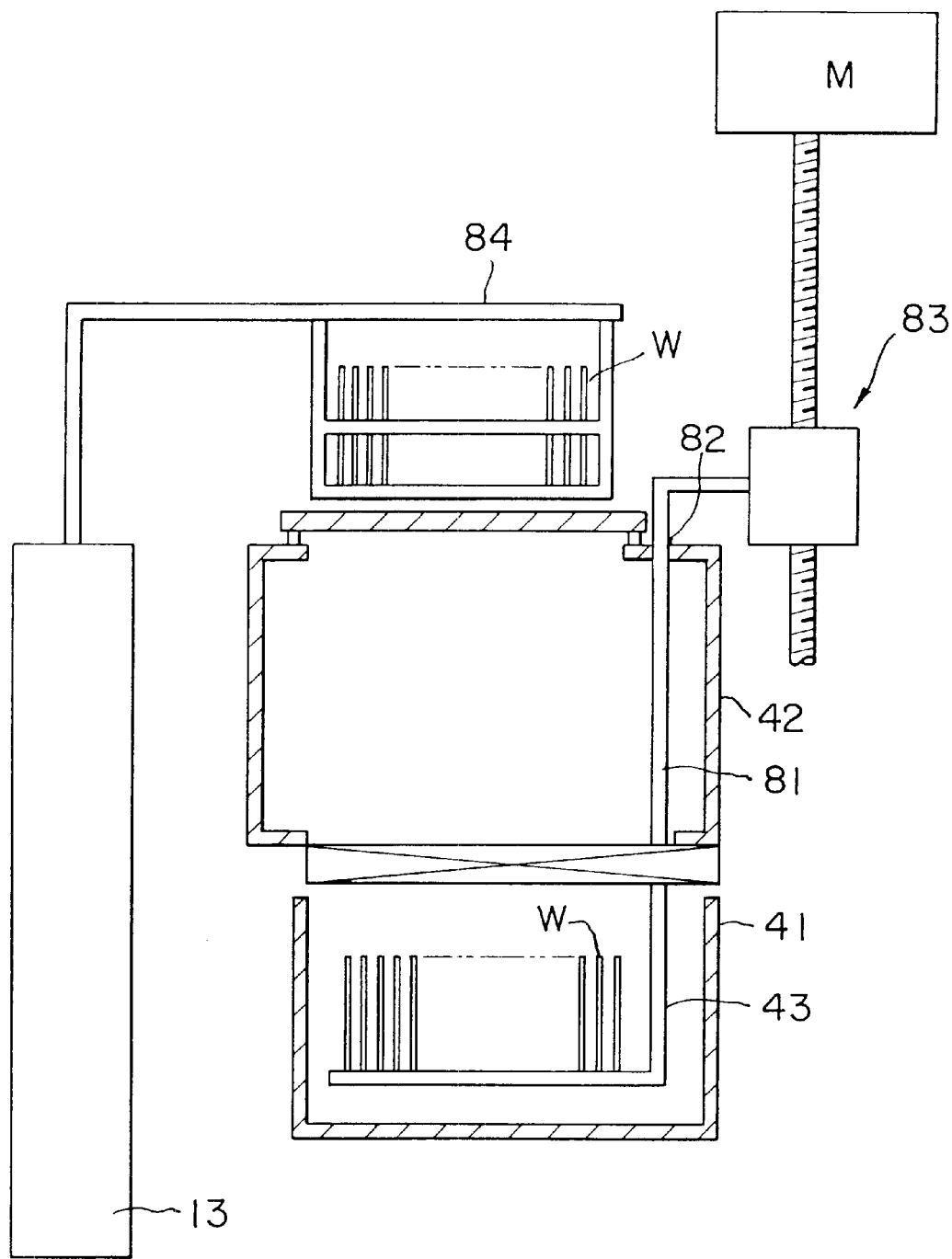
F I G. 5

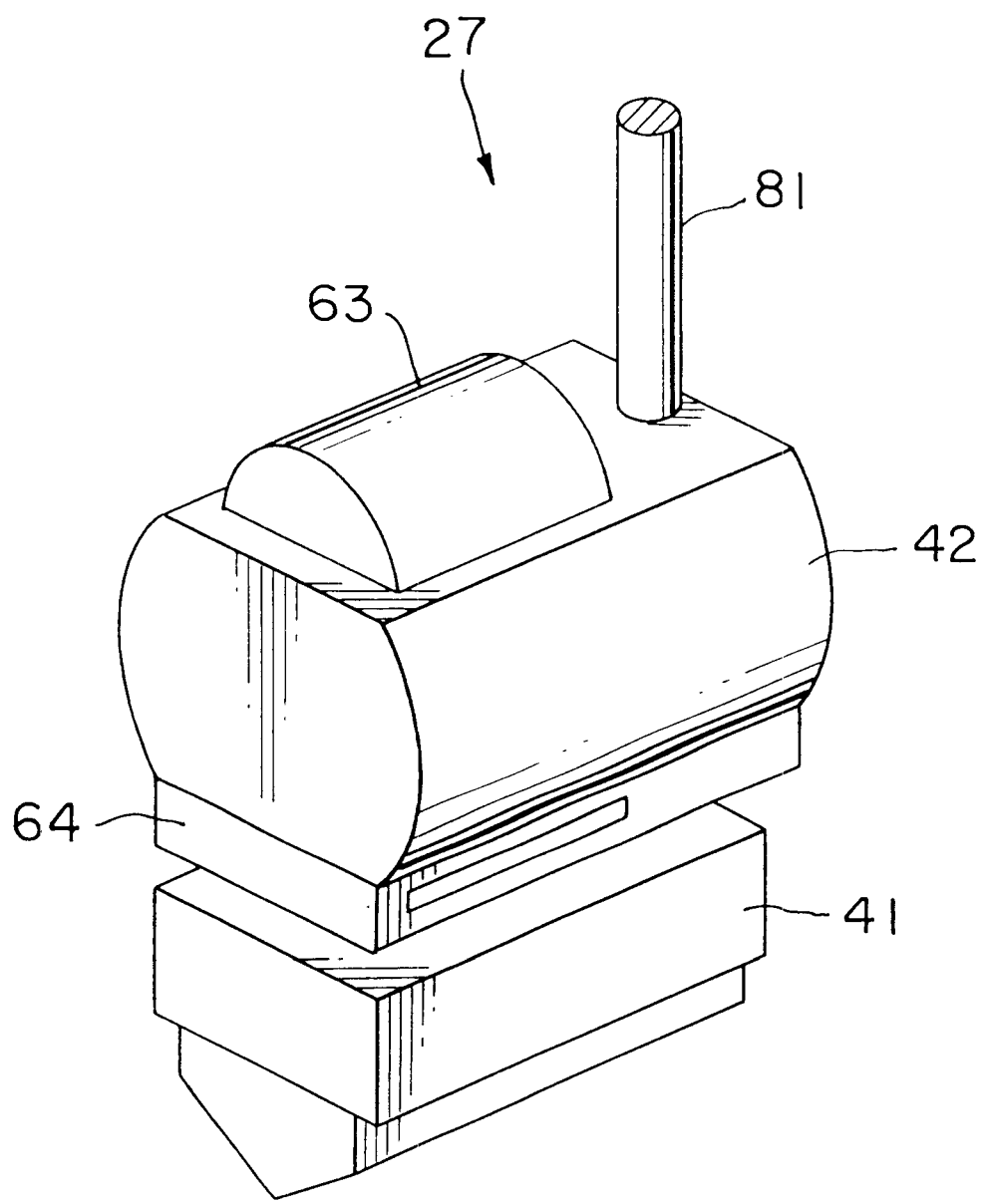
F I G. 6

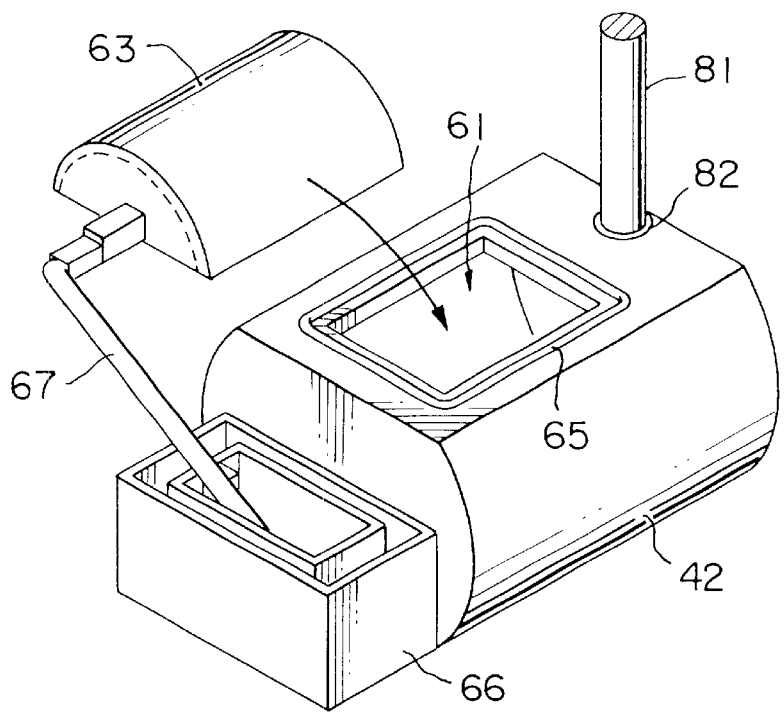
F I G. 7
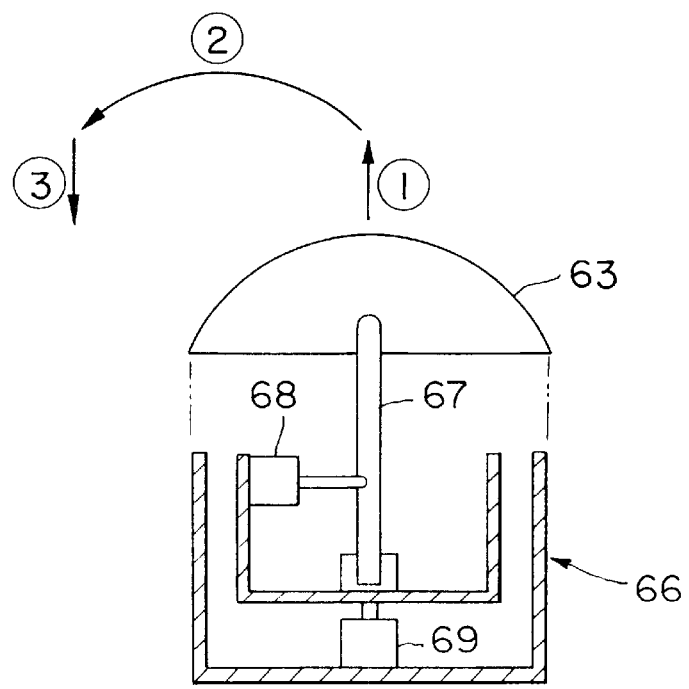
F I G. 8

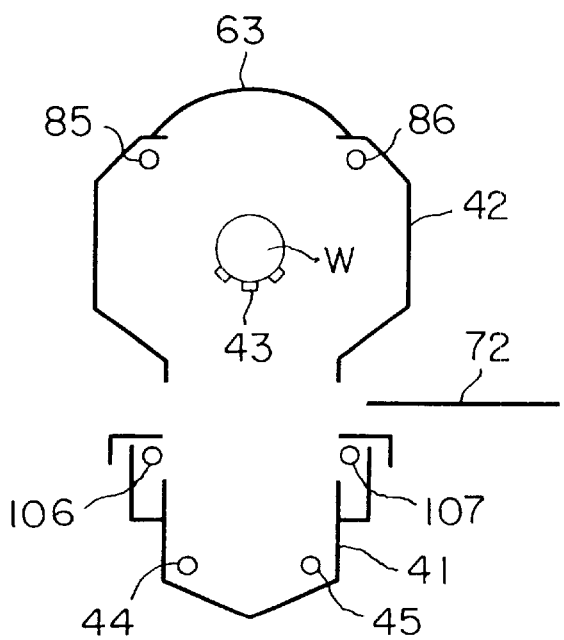
F I G. 16
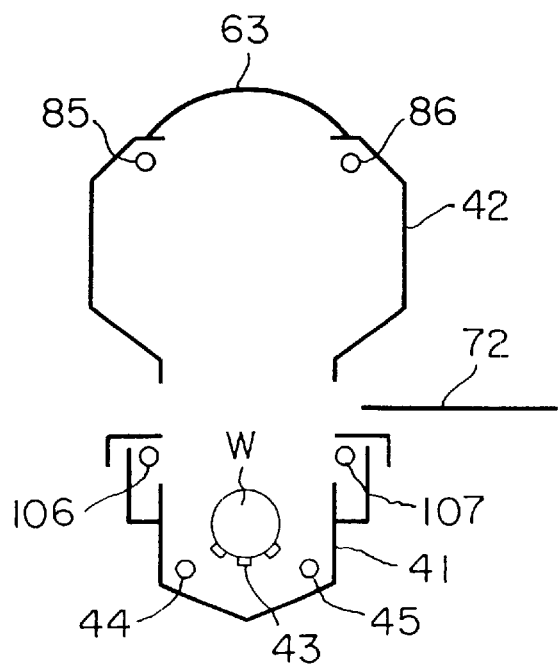
F I G. 17

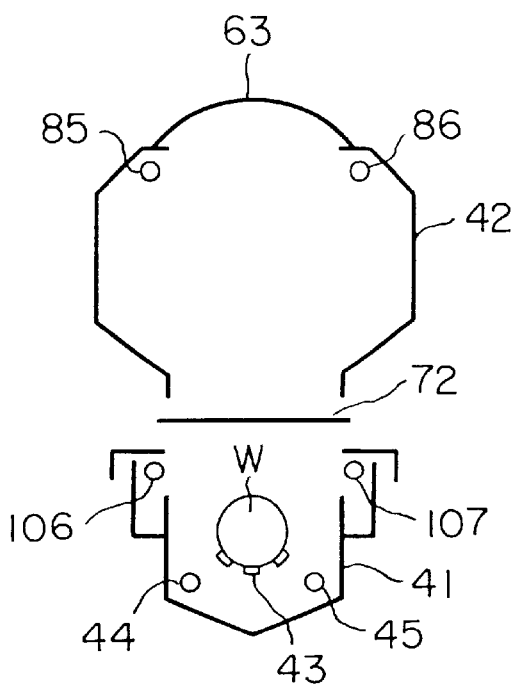
F I G. 18
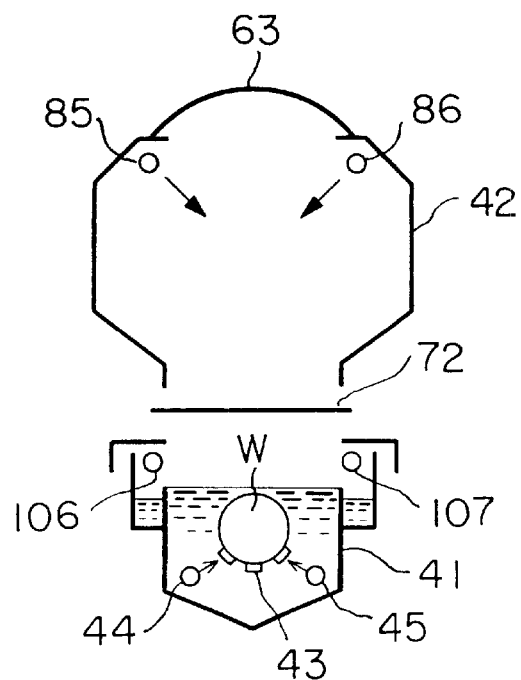
F I G. 19

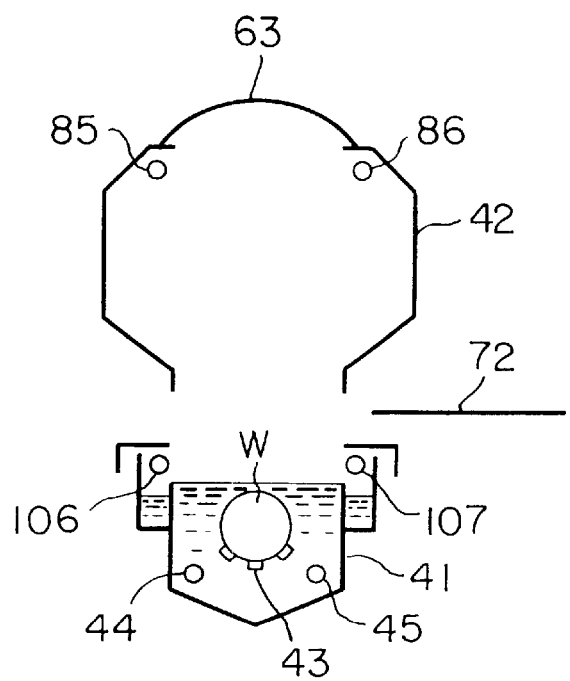
F I G. 20
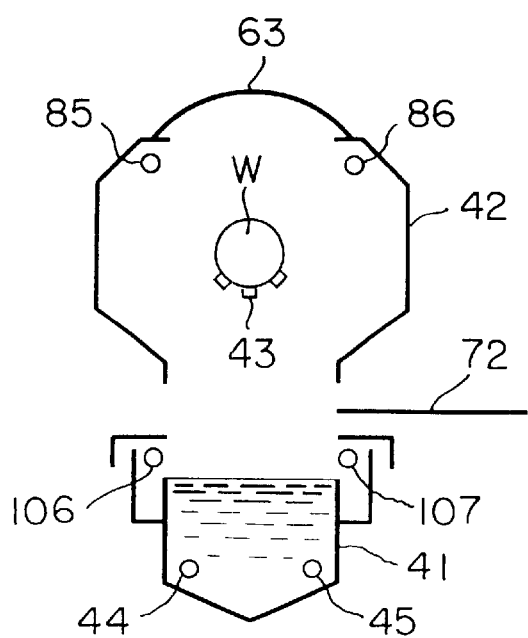
F I G. 21

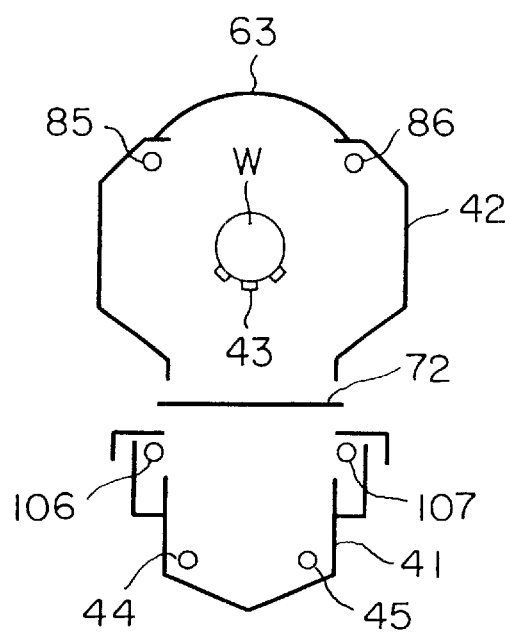
F I G. 22
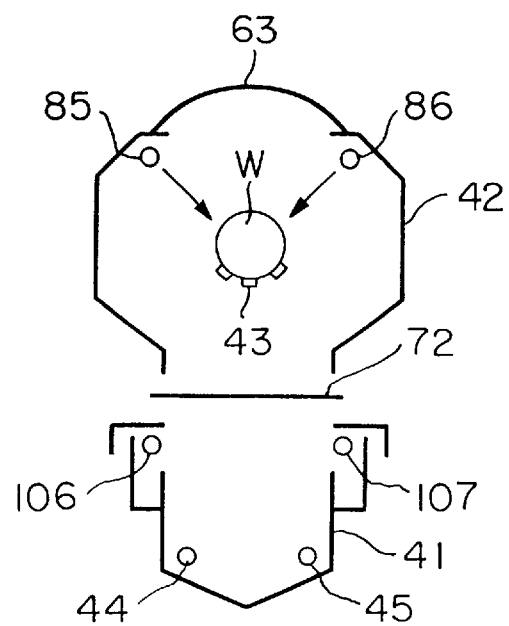
F I G. 23

APPARATUS FOR AND METHOD OF CLEANING OBJECTS TO BE PROCESSED

BACKGROUND OF THE INVENTION

The present invention relates to a cleaning apparatus and a cleaning method, by which objects to be processed, such as semiconductor wafers and glass substrates for a LCD (liquid crystal display) unit etc., are immersed and cleaned in chemical and subsequently dried.

For example, in a cleaning treatment of a manufacturing process for a semiconductor device, such as LSI etc., various cleaning apparatuses are employed for removing contaminants on the surfaces of the semiconductor wafers, such as particles, organic contaminants, metallic impurities and so on, and for etching the surface of the wafer. Note, in this specification, the semiconductor wafer(s) will be called the wafer(s) for short, hereinafter. Above all, a cleaning apparatus of "wet" type comes into wide use on the grounds that the above contaminants can be removed effectively, etching can be done and a batch processing can be accomplished to enhance the throughput in the cleaning process.

In such a wet type of cleaning apparatus, the wafers to be cleaned are subjected to a chemical cleaning process (e.g. ammonia treatment, hydrogen fluoride treatment, sulfuric acid treatment etc.) a washing cleaning process using pure water etc., and a drying process using isopropyl alcohol $[(CH_3)_2CHOH]$ or the like. Note, the isopropyl alcohol will be referred the IPA, hereinafter. Further, the cleaning apparatus is so constructed to supply the chemicals, the pure water and the IPA to processing baths in processing order and a drying room, respectively. Thus, with the above arrangement, a batch processing method where the wafers in blocks of e.g. 50 sheets are successively immersed in the processing baths and dried in the drying room, comes into wide use.

However, the provision of the processing baths and the drying room for each process causes the apparatus to be large-sized undesirably. In addition, because of a lot of opportunities for transporting the wafers in the apparatus, in other words, being exposed to atmosphere, there is a great possibility of the particles' sticking to the wafers.

Therefore, in e.g. Japanese Unexamined Patent Publication (kokai) No. 64-81230 and the same No. 6-326073 etc., there are proposed cleaning apparatuses in each of which the processing baths and. the drying room are formed in one body, so that the above-mentioned chemical process and drying process are carried out in one chamber. FIG. 1 shows one example of the cleaning apparatuses in the publications, representatively.

The shown cleaning apparatus comprises a chamber 200 and chemical (liquid) 202 stored in a lower portion 201 of the chamber 200. In processing, a wafer W is firstly immersed in the chemical 202. Thereafter, the wafer W is pulled up from the chemical 202 and then subjected to the drying process using the IPA etc. at an upper portion 203 of the chamber 200.

In the above-mentioned drying process while heating, however, there is a possibility that chemical atmosphere remaining in an upper area of the chamber 200 exerts a bad influence on the wafer W during the drying process. Furthermore, since there is a need to meet respective requirements of the chemical and drying processes simultaneously, the degree of freedom is restricted in design of the cleaning apparatus. Therefore, it is difficult to adopt various ideas to realize a high-speed cleaning process, a miniaturization of the chamber and so on.

SUMMARY OF THE INVENTION

Accordingly, it is therefore an object of the present invention to provide a cleaning apparatus and a cleaning method, by which a object to be processed is not subjected to a bad influence from the chemical process during the drying process.

It is the other object of the present invention to provide a cleaning apparatus which has a high degree of freedom in design thereby to clean the objects rapidly and miniaturize the apparatus itself, and a cleaning method realized by using the cleaning apparatus.

It is the other object of the present invention to provide a cleaning apparatus and a cleaning method, by which it is possible to execute the drying process more effectively.

It is the other object of the present invention to provide a cleaning apparatus which is capable of preventing surfaces of the objects from being oxidized.

It is the other object of the present invention to provide a cleaning apparatus in which a processing bath and a drying section are separated from each other thereby to prevent mist etc. of treatment liquids from entering into a drying chamber thereby to accomplish a stable drying performance of the apparatus, and a cleaning method realized by using the cleaning apparatus.

As a first feature of the present invention, the above-mentioned objects described above can be accomplished by a cleaning apparatus comprising:

- a processing bath for storing processing liquid in which the object is immersed;
- a drying chamber arranged above the processing bath and provided with an opening which is disposed between a body of the drying chamber and the processing bath and through which the object is transported, the opening being capable of closing;
- transporting means for transporting the object between the processing bath and the drying chamber through the opening; and
- first blowing means arranged in the drying chamber, for blowing gas containing inert gas against the object.

Further, a second feature of the present invention resides in the cleaning apparatus in accordance with the first feature, further comprising second blowing means arranged between the processing bath and the drying chamber, for blowing the gas containing the inert gas against the object transported from the processing bath to the drying chamber.

A third feature of the present invention resides in the cleaning apparatus in accordance with the first feature, further comprising heating means arranged in the drying chamber, for heating the object.

A fourth feature of the present invention resides in the cleaning apparatus in accordance with the first feature, wherein the first blowing means blows the gas containing the inert gas over said object from an upper section of the drying chamber in a downward flowing manner; and further including:

discharging means for discharging the gas blown out from the first blowing means from a lower section of the drying chamber;

wherein the discharging means includes an exhaust port through which the gas is discharged from the drying chamber.

A fifth feature of the present invention resides in the cleaning apparatus in accordance with the fourth feature, further comprising rectifying means for communicating with the exhaust port and having a plurality of intake ports for introducing the gas containing the inert gas, which has been blown out from the first blowing means, through a lower section of the drying chamber.

A sixth feature of the present invention resides in the cleaning apparatus in accordance with the first or second feature, wherein the inert gas is nitrogen gas.

A seventh feature of the present invention resides in the cleaning apparatus in accordance with the first or second feature, wherein the inert gas is heated inert gas.

An eighth feature of the present invention resides in the cleaning apparatus in accordance with the sixth feature, wherein the gas containing the inert gas is a mixed gas composed of an organic solvent and inert gas.

A ninth feature of the present invention resides in the cleaning apparatus in accordance with the sixth feature, wherein the gas containing the inert gas is a mixed gas composed of an organic solvent and heated inert gas.

A tenth feature of the present invention resides in the cleaning apparatus in accordance with the first feature, wherein the processing liquid stored in the processing bath is a deaerated rinse.

An eleventh feature of the present invention resides in a cleaning method of cleaning a object to be processed, the cleaning method comprising the steps of:

(a) immersing the object into a processing bath for storing processing liquid;

(b) transporting the object from the processing bath to a drying chamber arranged above the processing bath through an opening which is capable of opening and closing;

(c) closing the opening after the object has been transported to the drying chamber; and (d) blowing gas containing inert gas against the object;

A twelfth feature of the present invention resides in a cleaning method of cleaning a object to be processed, the cleaning method comprising the steps of:

(a) immersing the object into a processing bath for storing processing liquid;

(b) transporting the object from the processing bath to a drying chamber arranged above the processing bath through an opening which is capable of opening and closing;

(c) blowing gas containing inert gas against the object; and (d) closing the opening.

A thirteenth feature of the present invention resides in the cleaning method in accordance with the eleventh or twelfth feature, wherein, prior to the step of (b), the drying chamber has been filled up with an atmosphere of an organic solvent.

According to the first feature of the invention, since the drying chamber and the processing bath are separated from each other up and down while a space of the drying chamber can be insulated from a space of the processing bath through the closing opening, the object has no possibility to receive a bad influenced from the chemical treatment during the drying process. In addition, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the cleaning apparatus is constructed so as to blow off the processing liquid on the surface of the object by blowing the gas containing the cooled inert gas, it impossible to carry out the drying process more effectively. In addition, since the space for drying the object to be processed is defined apart from the space for the processing bath, it is possible to decrease the former space as possible, thereby realizing the effective drying process.

According to the second feature of the invention, since the second blowing means, which blows the gas containing cooled inert gas against the object on transportation from the processing bath to the drying chamber, serves to assist the drying process for the object, the drying process can be carried out more effectively.

According to the third feature of the invention, since the temperature of the drying chamber can be raised by the heating means, it is possible to execute the drying process more effectively.

According to the fourth feature of the invention, since the gas containing the inert gas flowing downward allows the processing liquid to be blown off the surface of the object, it is also possible to carry out the drying process more effectively.

According to the fifth feature of the invention, since the rectifying means allows the gas containing the inert gas flowing downward to flow against the object uniformly, it is possible to carry out the drying process more effectively.

According to the sixth feature of the invention, owing to using of the nitrogen gas as the inert gas, if the object to be processed is made of silicon element, it is possible to prevent the surface of the object from being oxidized. Further, according to the seventh to ninth features, it is possible to carry out the drying process more effectively.

According to the tenth feature of the invention, since the processing liquid stored in the processing bath is the deaerated rinse, it is possible to prevent the surface of the object from being oxidized in case of the object made of silicon element.

According to the eleventh and twelfth features of the invention, after the object has been transported from the processing bath to the drying chamber, the opening is then closed to shelter the space and thereafter, the object is subjected to the drying process. Thus, the object has no possibility to receive a bad influenced from the chemical treatment during the drying process. Further, since the forthcoming process in the next processing bath can be prepared while the drying process is executed, it is possible to improve throughput of the cleaning apparatus. Additionally, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the cleaning apparatus is constructed so as to blow off the processing liquid on the surface of the object by blowing the gas containing the inert gas, it is possible to carry out the drying process more effectively. In addition, since the space for drying the object to be processed is defined apart from the space for the processing bath, it is possible to decrease the former space as possible, thereby realizing the effective drying process.

According to the thirteenth feature of the invention, since the drying chamber has been already fulfilled up with the atmosphere of the organic solvent before the object is transported to the drying chamber, it is possible to execute the drying process more effectively.

The above and other features and advantages of this invention will become apparent, and the invention itself will best be understood, from a study of the following description

BRIEF DESCRIPTION OF THE DRAWINGS

FIG. 5 is another longitudinal cross sectional side view of the cleaning unit of FIG. 4;

FIG. 6 is a perspective view of the cleaning unit of FIG. 4;

FIG. 7 is a perspective view showing the vicinity of an upper lid of the cleaning unit of FIG. 4;

FIG. 8 is a view showing a schematic structure of a lid driving section of the cleaning unit of FIG. 4;

FIG. 16 is a schematic view showing the operation of the cleaning unit of FIG. 4, corresponding to a step 1203 of FIG. 13;

FIG. 17 is a schematic view showing the operation of the cleaning unit of FIG. 4, corresponding to a step 1204 of FIG. 13;

FIG. 18 is a schematic view showing the operation of the cleaning unit of FIG. 4, corresponding to a step 1205 of FIG. 13;

FIG. 19 is a schematic view showing the operations of the cleaning unit of FIG. 4, corresponding to steps 1206 to 1208 of FIG. 13;

FIG. 20 is a schematic view showing the operation of the cleaning unit of FIG. 4, corresponding to a step 1209 of FIG. 13;

FIG. 21 is a schematic view showing the operation of the cleaning unit of FIG. 4, corresponding to a step 1210 of FIG. 13;

FIG. 22 is a schematic view showing the operation of the cleaning unit of FIG. 4, corresponding to a step 1211 of FIG. 13;

FIG. 23 is a schematic view showing the operation of the cleaning unit of FIG. 4, corresponding to a step 1212 of FIG. 13;

DESCRIPTION OF THE PREFERRED EMBODIMENT

One embodiment of the present invention will be described with reference to drawings.

Figure 1:
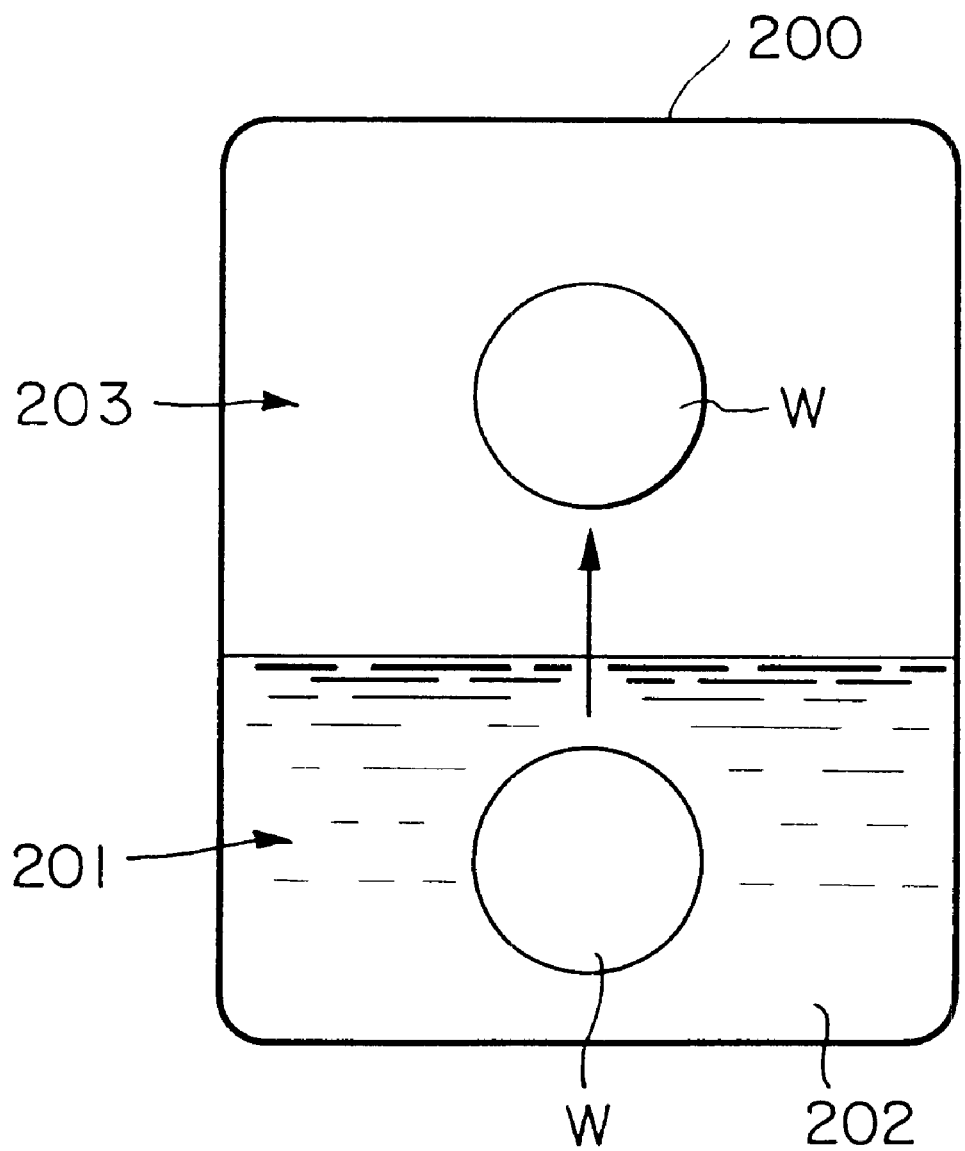
FIG. 1 is a schematic view of a conventional cleaning apparatus.
Figure 2:
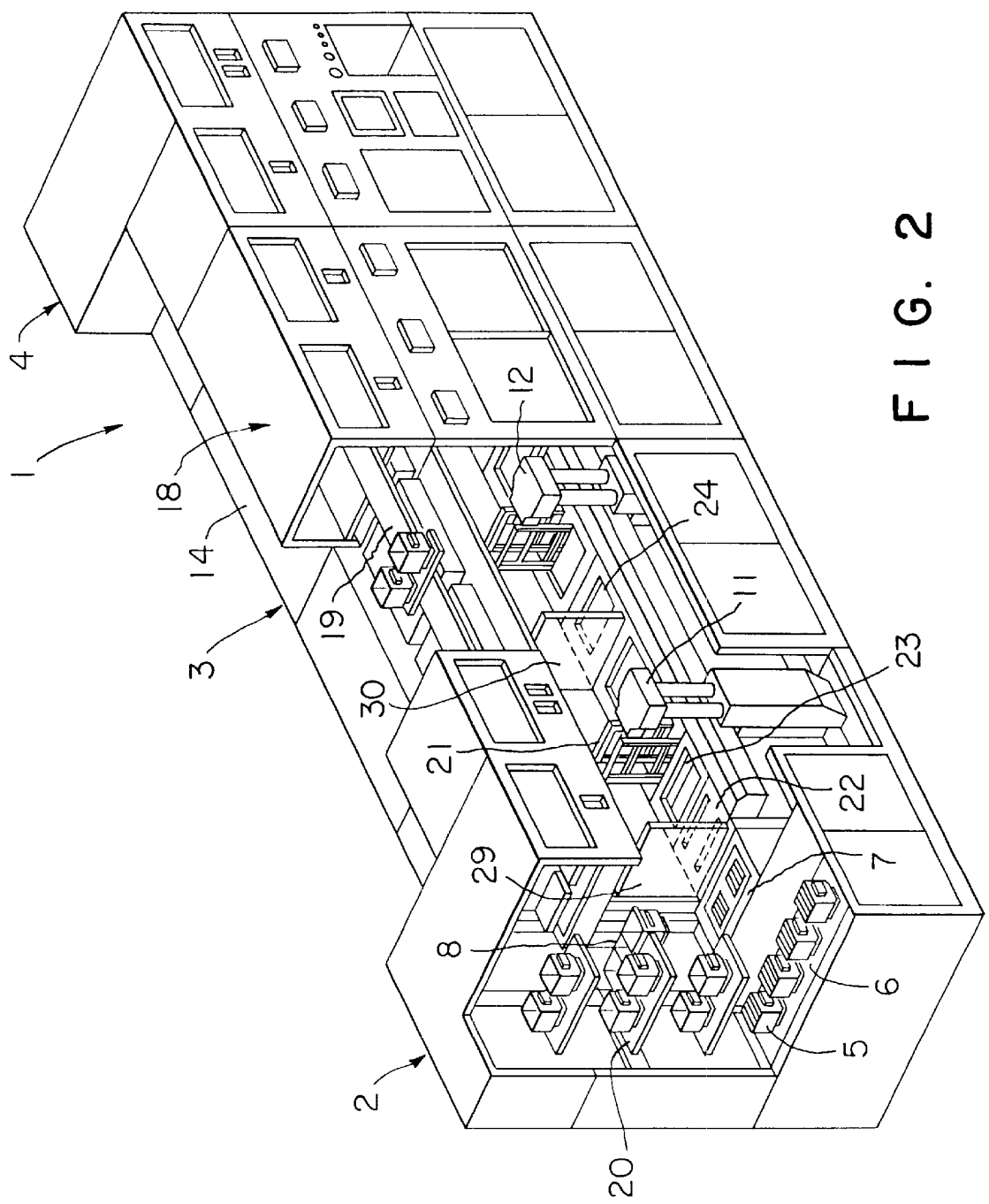
FIG. 2 is a cleaning apparatus for semiconductor wafers, in accordance with one embodiment of the present invention.
Figure 3:
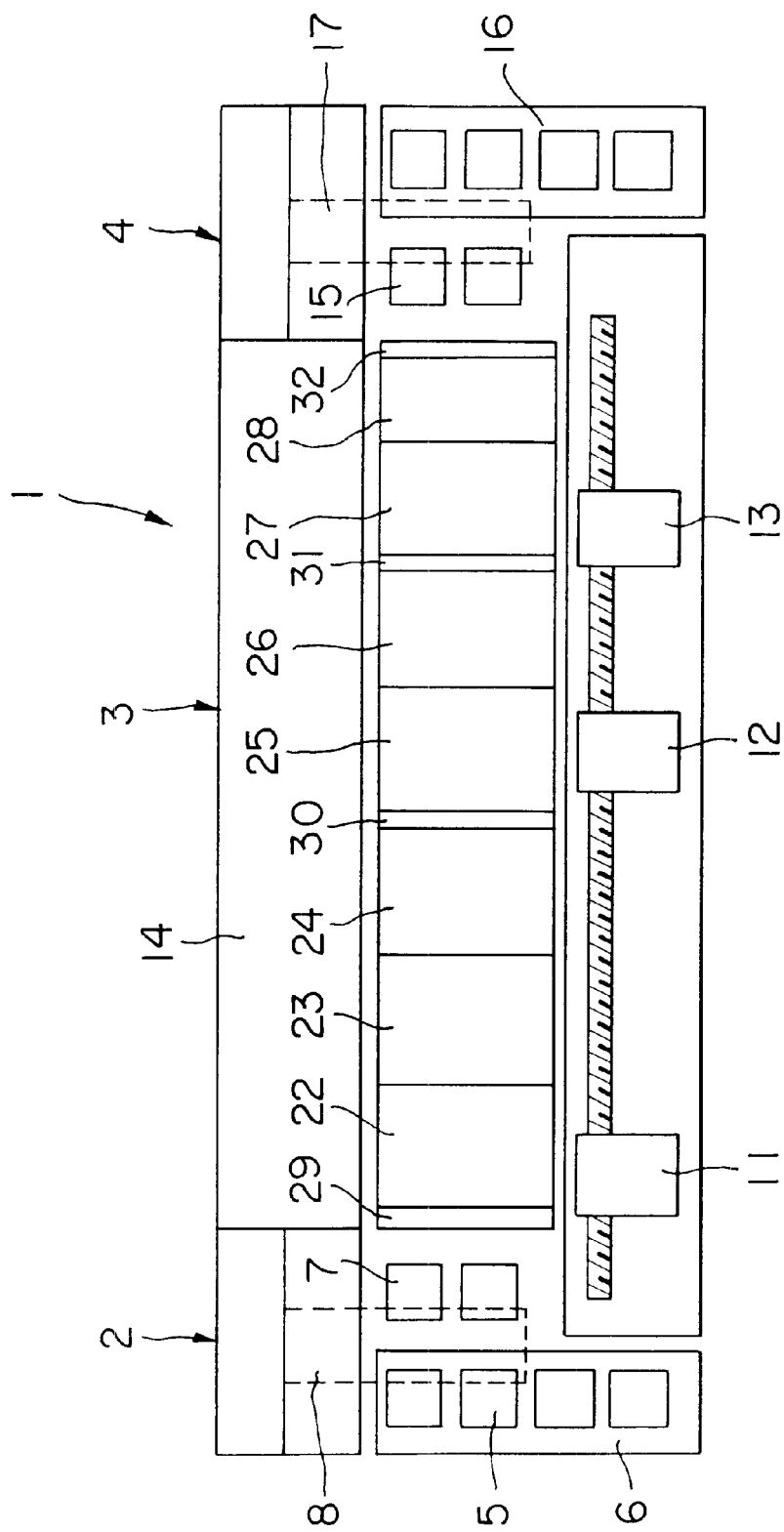
FIG. 3 is a plan view of the cleaning apparatus of FIG. 2.

First of all, we now describe a cleaning apparatus for cleaning semiconductor wafers, as an example to which the invention is applied. Note, through the description, the semiconductor wafer(s) will be also referred as "wafer(s)", hereinafter. As shown in FIGS. 2 and 3, the whole cleaning apparatus 1 comprises a loading section 2 for accommodating the wafers before cleaning in blocks of carriers, a cleaning section 3 for cleaning the wafers, and an unloading section 4 for picking up the wafers after cleaning and drying in the section 3 into the carriers C every predetermined number of blocks of cassettes. Thus, the cleaning apparatus 1 of the embodiment is constituted by three processing zones.

Arranged in the loading section 2 are a stand-by part 6 which causes carriers 5 having predetermined number (e.g. twenty-five sheets) of precleaning wafers accommodated therein to stand by and a loader part 7 which carries out a picking-up operation of the wafers from the carriers 5, an aligning operation of respective orientation flats of the wafers, and a counting operation for the number of wafers. Further, the loading section 2 is provided with a transfer arm 8 which transports the carriers 5, which have been loaded from the outside by a transporting robot etc., to the stand-by part 6 and also between the stand-by part 6 and the loader part 7.

In the cleaning section 3, three wafer transfer units 11, 12, 13 are arranged on the front side (this side in FIG. 2) of the section 3, while a piping area 14 is defined on the back side of the section 3 through partition walls, for housing various tanks for reserving processing liquids, such as chemicals, and various pipes.

On the other hand, the unloading section 4 includes an unloader part 15 for accommodating the wafers cleaned in the cleaning section 3 in the carriers 5, a stand-by part 16 for causing the carriers 5 with the wafers to stand by, and a transfer arm 17 for transporting the carriers 5 between the unloader part 16 and the stand-by part 17.

Note, the cleaning apparatus 1 further includes a carrier transfer section 18 which transports the carriers 5 emptied in the loading section 2. The carrier transfer section 18 is equipped with a carrier conveyer 19 arranged above the cleaning section 3, a carrier stock 20 for receiving the emptied carriers 5 from the loader part 7 of the loading section 2 by means of the transfer arm 8 and stocking the carriers 5 with and without the wafers, and a not-shown delivering part which receives the emptied carriers 5 from the carrier conveyer 19 by means of the transfer arm 17 at the unloading section 4 and delivers the emptied carriers 5 to the unloader part 15.

The cleaning section 3 is provided with the following baths in order from the side of the loader part 7: a chuck cleaning/drying bath 22 for cleaning and drying a wafer chuck 21 of the wafer transfer unit 11; a chemical cleaning bath 23 for removing impurities, such as organic contaminants, metallic impurities particles or the like, on the surface of the wafer by using the chemicals, such as ammonium hydrogen peroxide ($NH_4OH/H_2O_2/H_2O$); a wash cleaning bath 24 for cleaning the wafers cleaned in the bath 23 by e.g. pure water; a chemical cleaning bath 25 for removing metallic contaminations on the wafers by a chemical, such as a mixture of $HCl/H_2O_2/H_2O$; a wash cleaning bath 26 for cleaning the wafers cleaned in the bath 25 by e.g. pure water; and a cleaning unit 27 of the invention for removing an oxide on the wafers by a chemical (e.g. a mixture of $HF/H_2O$), cleaning the washed wafers by the rinse (e.g. pure water) and drying the cleaned wafers; and a chuck cleaning and drying bath 28 for cleaning and drying not-shown wafer chucks of the wafer transfer unit 13.

Note, partition plates 29, 30, 31, 32 are interposed between the loader part 7 and the chuck cleaning/drying bath 22, between the wash cleaning bath 24 and the chemical cleaning bath 25, between the wash cleaning bath 26 and the cleaning unit 27, and between the chuck cleaning and drying bath 28 and the unloader part 15, respectively. These partition plates 29, 30, 31, 32 are adapted so as to open upward and shut downward in receiving and delivering the wafers by driving mechanisms which are not shown in the figures. Owing to the provision of the partition plates 29, 30, 31, 32, it is possible to prevent atmosphere (vapors) of the chemicals from diffusing into the adjoining spaces.

We now describe the structure of the cleaning unit 27 with reference to FIGS. 4 to 12. The cleaning unit 27 includes a cleaning bath 41 as a processing bath reserving the processing liquids of chemicals (e.g. mixture of $HF/H_2O$) and the rinse (e.g. pure water) and immersing the wafers to be processed in the liquids, and a cylindrical drying chamber 42 arranged above the cleaning bath 41 for drying the wafers W transported from the cleaning bath 41.

The cleaning bath 41 accommodates a wafer guide 43 and e.g. fifty sheets of wafers W carried by the wafer guide 43. Further, the cleaning bath 41 is provided, on both sides of a bottom thereof, with nozzles 44, 45 for ejecting the processing liquid for the wafers W accommodated therein. The nozzles 44, 45 may be constituted by pipes each of which has respective injection orifices formed at each interval equal to a distance between the adjoining wafers W along the direction of the wafers' arrangement. Into the nozzles 44, 45, either one of the chemical (e.g. mixture of $HF/H_2O$) and the rinse such as pure water (DIW: deionized water) is supplied from the piping area 14 shown in FIGS. 2 and 3 by a switching operation of a switching valve 46. The switching. operation of the switching valve 46 is controlled by a not-shown controller at predetermined timing. Note, in order to prevent the oxidation of the wafers W, it is preferable to use the deaerated DIW as the rinse.

Additionally, in the circumference of the cleaning bath 41, a collect bath 47 is provided for collecting the processing liquid overflowing the cleaning bath 41. The processing liquid collected by the collect bath 47 is adapted so as to circulate in the nozzles 44, 45 through a switching valve 48, a pump 49, a filter 50 and a switching valve 51. In the switching valve 48, it is set whether to circulate the processing liquid collected by the collect bath 47 in the above-mentioned manner or to discharge the liquid. In the switching valve 51, it is set whether to circulate the processing liquid collected by the collect bath 47 or to supply the DIW to the nozzles 44, 45. Note, a damper 52 is disposed between the pump 49 and the filter 50. At the lowermost of the cleaning bath 41, an exhaust port 53 is arranged to drain the processing liquid. In the switching valve 54, it is set whether to drain the processing liquid through the exhaust port 53 or not.

The drying chamber 42 is provided, on upper and lower parts thereof, with rectangular upper and lower openings 61, 62 for receiving and delivering the wafers W, respectively. A lid 63 is laid on the upper opening 61, while a slide door arrangement 64 is provided at the lower opening 62.

The lid 63 is made of resin, such as PVC (polyvinyl chloride) and PP (polypropylene) etc., and shaped like a semi-cylinder at both of the interior and exterior, as shown in FIG. 6. Thus, such a formation of the lid 63 causes the interior of the drying chamber 42 closed by the lid 63 to be defined substantially cylindrically, while preventing a stream of nitrogen gas etc. blown against the wafers W from being turbulent. Consequently, the nitrogen gas or the like can be blown against the respective wafers W uniformly. In addition, as shown in FIG. 7, an O-ring 65 is arranged around the periphery of the upper opening 61 to enhance the sealing capability of the chamber 41 when the upper opening 61 is closed by the lid 63.

Arranged in the vicinity of the drying chamber 42 is a lid actuator 66 which drives to open and shut the lid 63. As shown in FIG. 8, the lid actuator 66 includes a cylinder 68 for rotating a pivot arm 67 having an end fixed to the lid 63, and another cylinder 69 for moving the lid 63 and these rotating arrangements (the cylinder 68, the arm 67) upward and downward. In operation for opening the lid 63, the lid actuator 66 firstly moves the lid 63 closing the upper opening 61 upward (see $\hat{1}$ of FIG. 8). Subsequently, the lid actuator 66 further rotates the lid 63 to a position apart from the upper opening 61 (see $\hat{2}$ of FIG. 8) and moves the lid 63 downward (see $\hat{3}$ of FIG. 8). In this way, the upper opening 51 is opened. On the contrary, when it is required to close the upper opening 61 by the lid 63, the above-mentioned operations will be executed in reverse order (i.e. $\hat{3} \rightarrow \hat{2} \rightarrow \hat{1}$ of FIG. 8).

Figure 9:
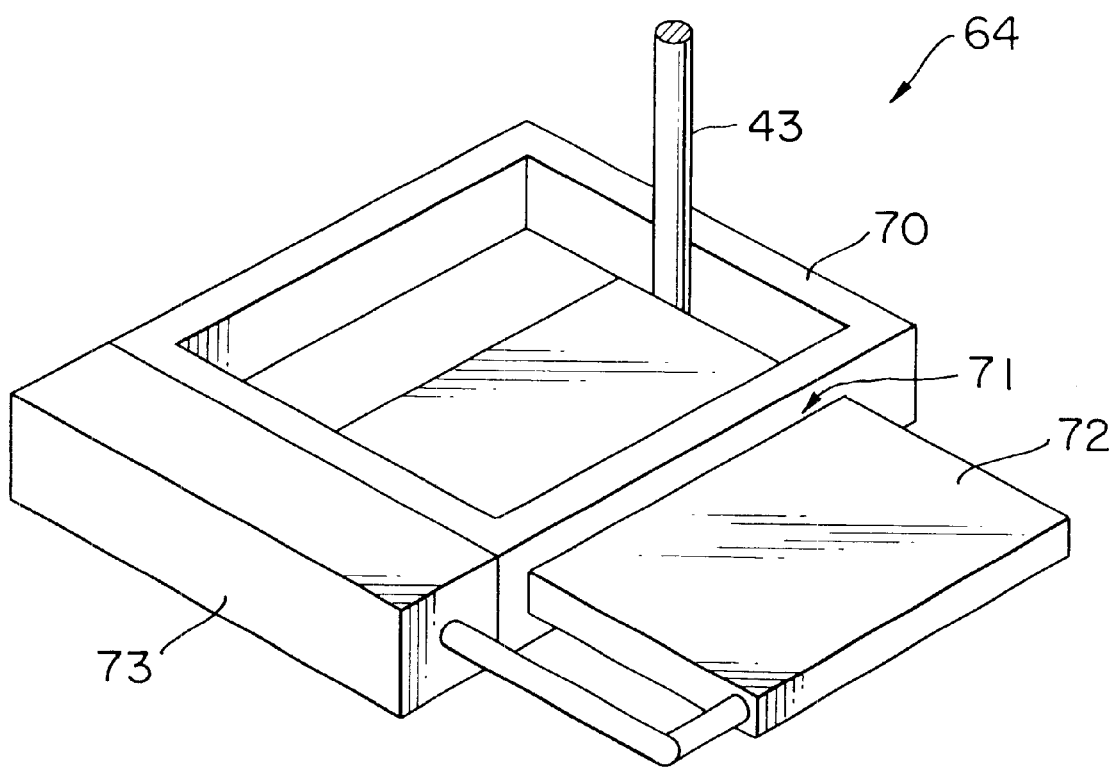
FIG. 9 is a perspective view showing a sliding door arrangement of the cleaning unit of FIG. 4.

As shown in FIG. 9, the slide door arrangement 64 comprises a rectangular flange 70 disposed between the cleaning bath 41 and the drying chamber 42, a slide door 72 inserted into an opening 71 formed in the flange 70 to open and close an interior of the flange 70, and a cylinder 73 for driving the slide door 72. Similar to the lid 63, the slide door 72 is made of resin, such as PVC (polyvinyl chloride) and PP (polypropylene) etc., and rectangular-shaped similarly to the lower opening 62.

Figure 10:
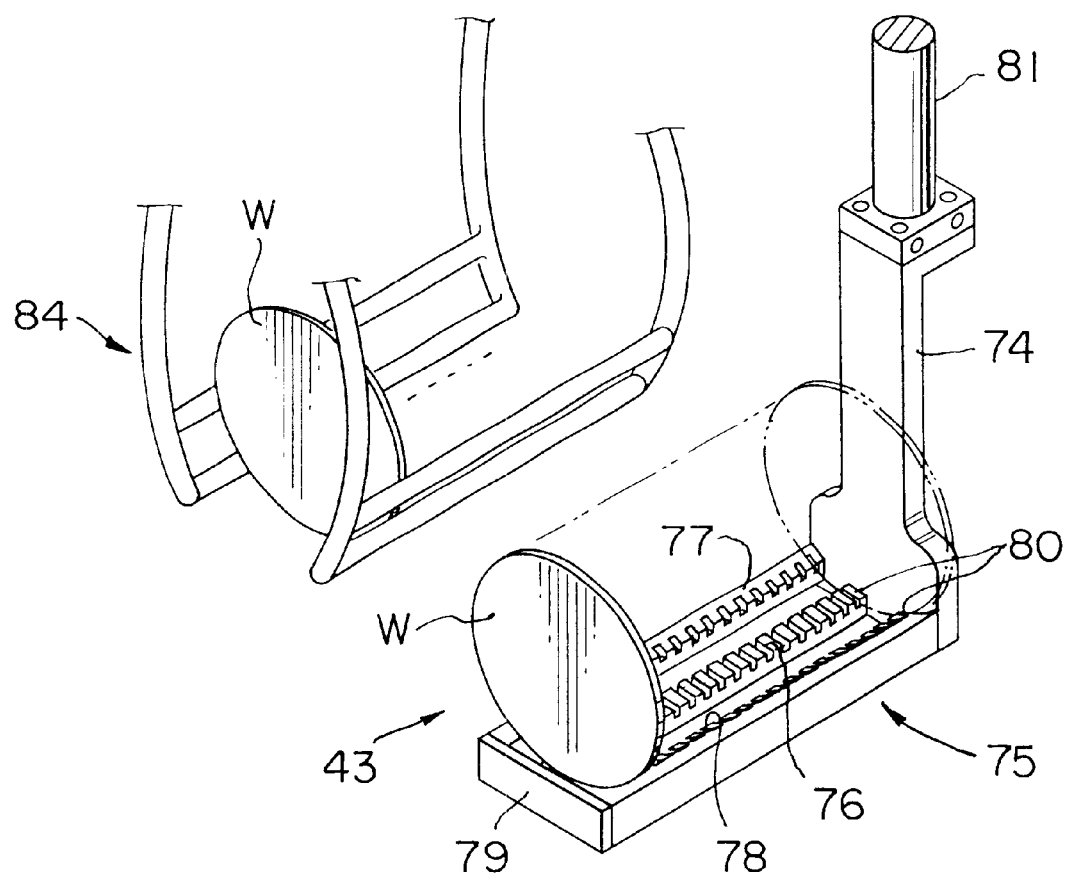
FIG. 10 is a perspective view showing a wafer guide of the cleaning unit of FIG. 4.

As shown in FIG. 10, the wafer guide 43 is provided, at an lower end of a carrying member 74 thereof, with a wafer support 75 for supporting a plurality of wafers W (e.g. 50 sheets). The wafer support 75 consists of an intermediate supporting rod 76 and two lateral supporting rods 77, 78 arranged in parallel with each other on both sides of the rod 76. Respective ends of the rods 76, 77, 78 are fixed with a lower end of the carrying member 74, while the other ends of the rods 76, 77, 78 are secured to a fixing member 79. Each of the rods 76, 77, 78 has a plurality of retaining grooves 80, 80 . . . , 80 (e.g. fifty grooves) formed at predetermined intervals in the longitudinal direction. The wafer guide 43 is made of materials exhibiting superior characteristics in corrosion resistance, heat resistance and durability, for example, PEEK (polyether ether ketone), Qz (quartz) and so on.

A guide elevating rod 81 is fixed to an upper end of the wafer guide 43. As shown in FIGS. 5 and 6, the guide elevating rod 81 is adapted so as to move upward and downward, projecting to the outside through a hole 82 formed on the top of the drying chamber 42. The upper end of the guide elevating rod 81 is connected with a wafer-guide Z-axis mechanism 83 arranged behind the drying chamber 42. Since the wafer-guide Z-axis mechanism 83 operates to move the guide elevating rod 81 up and down, the wafers W carried by the wafer guide 43 are transported between the cleaning bath 41 and the drying chamber 42 through the lower opening 62. Further, as shown in FIG. 5, the wafer transfer unit 13 (see FIG. 3) is arranged in front of the cleaning unit 27. In operation, as shown in FIG. 10, a wafer chuck 84 provided on the wafer transfer unit 13 receives, for example, fifty sheets of wafers W from the neighboring wash cleaning bath 26 and delivers them to the wafer guide 43 in the drying chamber 42. Furthermore, the wafer chuck 84 receives, for example, fifty sheets of wafers W from the wafer guide 43 in the drying chamber 42 and delivers them to the unloader part 15 of the unloading section 4.

Figure 4:
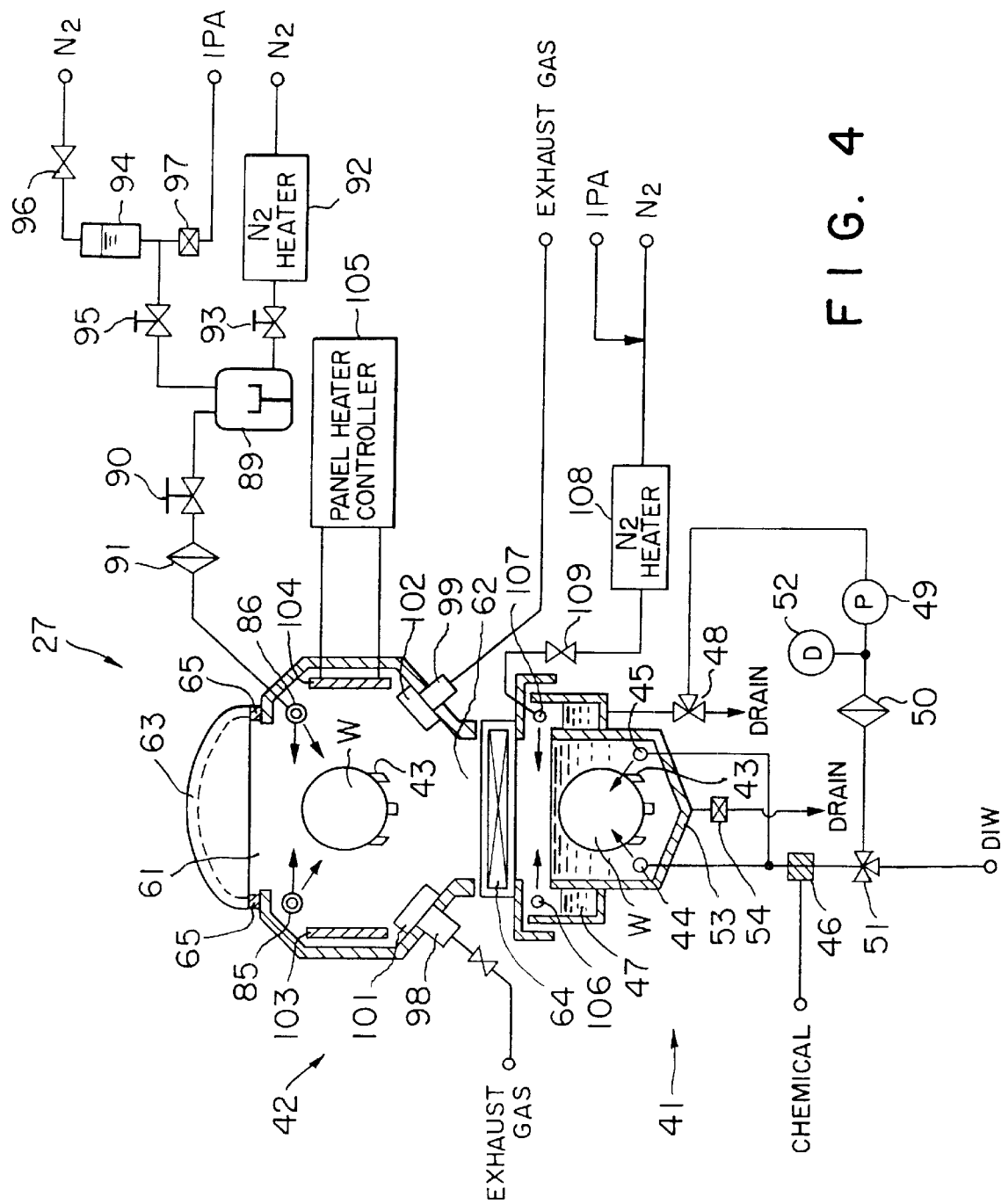
FIG. 4 is a longitudinal cross sectional front view of a cleaning unit of the cleaning apparatus of FIG. 2.
Figure 11:
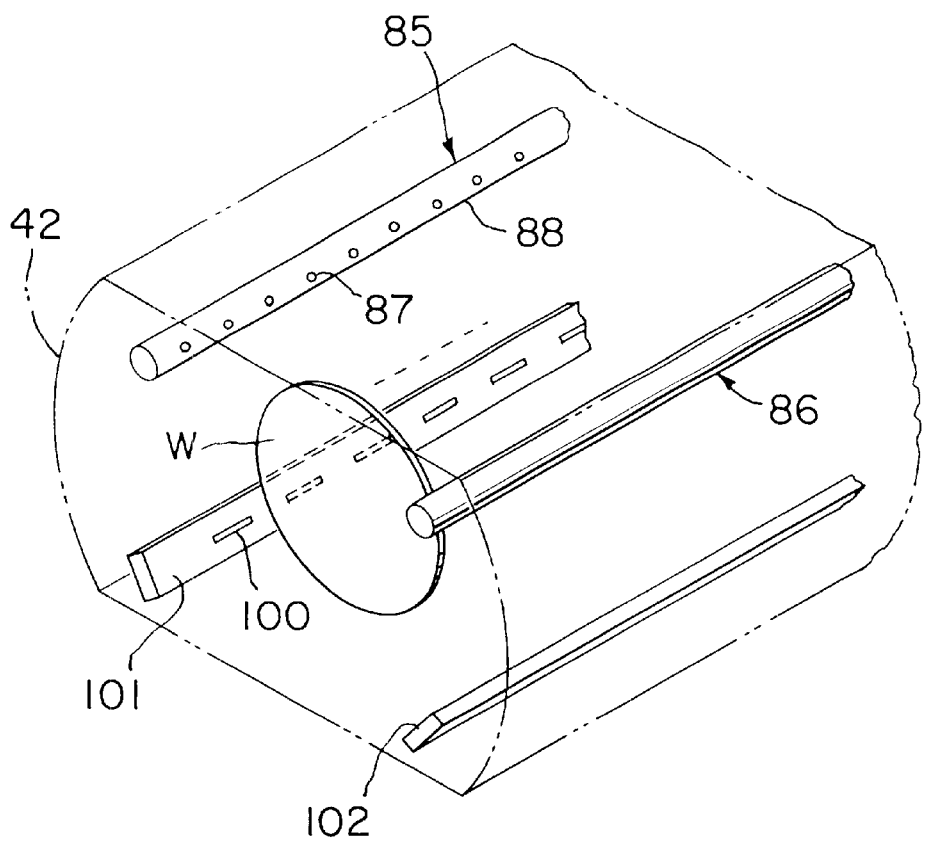
FIG. 11 is a perspective view showing nozzle and exhaust ports of the cleaning unit of FIG. 4.
Figure 12:
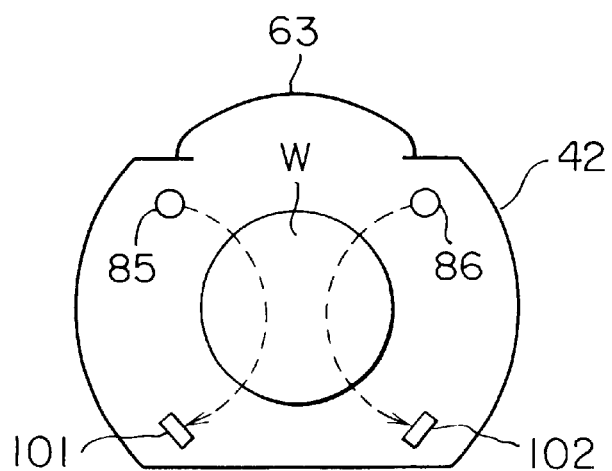
FIG. 12 is a view for explanation of an operation of rectifying plates of the cleaning unit of FIG. 4.

As shown in FIGS. 4 and 11, on both sides of the upper part of the drying chamber 42, two nozzles 85, 86 are arranged so as to blow the nitrogen gas etc. over the wafers W carried by the wafer guide 43 in a downward-flowing manner. The nozzles 85, 86 are constituted by pipes 88 having injection holes 87 formed at regular intervals each of which is identical to the distance between the adjoining wafers W in the direction of the wafers' arrangement. Into the nozzles 85, 86, a mixture composed of the IPA and heated nitrogen gas is supplied through an IPA evaporator 89, a control valve 90 and filter 91. Into the IPA evaporator 89, the heated nitrogen gas is supplied through a nitrogen heater 92 and a control valve 93, while the IPA is also supplied from an IPA tank 94 through a control valve 95. Similarly, the nitrogen is supplied to the IPA tank 94 through a control valve 96, while the IPA is also supplied to the IPA tank 94 through a control valve 97.

On the other hand, as shown in FIGS. 4 and 11, the drying chamber 42 is provided, on both sides of the lower part, with exhaust ports 98, 99 for discharging the nitrogen gas etc. blown out of the nozzles 85, 86. The exhaust ports 98, 99 are communicated with a not-shown exhaust pump. Also communicated with the exhaust ports 98, 99 are respective rectifying plates 101, 102 as rectifying means, which having a plurality of inlets 100, 100, . . . , 100 for sucking the nitrogen gas etc., which have been blown out of the nozzles 85, 86, through respective parts at the lower part of the drying chamber 42 uniformly. With the arrangement, as shown by dotted lines of FIG. 12, the nitrogen gas etc., which have been blown out of the injection holes 87 of the nozzles 85, 86, are flowing on the surfaces of the wafers W and subsequently sucked from the inlets 100 of the rectifying plates 101, 102. Thus, owing to the above-mentioned flow of the nitrogen gas etc., it is possible to prevent the occurrence of turbulence in the flows of the nitrogen gas etc. Note, the drying chamber 42 is also provided, at the lower part, with a drain port (not shown) for discharging the liquids.

Again in FIG. 4, a pair of panel heaters 103, 104 are arranged on both sides of a center of the drying chamber 42. These panel heaters 103, 104 are electrically connected to a panel heater controller 105 for controlling the temperature in the chamber 42. The temperature of the chamber 42 is maintained. to the extent that, for example, the IPA boils.

Provided between the cleaning bath 41 and the drying chamber 42, for example, on both sides of a space above the surface of the bath 41 are nozzles 106, 107 which blow the nitrogen gas against the, wafers W during transporting from the bath 41 to the chamber 42. The structures of the nozzles 106, 107 are substantially similar to those of the above-mentioned nozzles 85, 86. Into the nozzles 106, 107, the heated nitrogen gas or mixed gas composed of nitrogen gas and IPA is supplied through a nitrogen heater 108 and a control valve 109.

Figure 13:
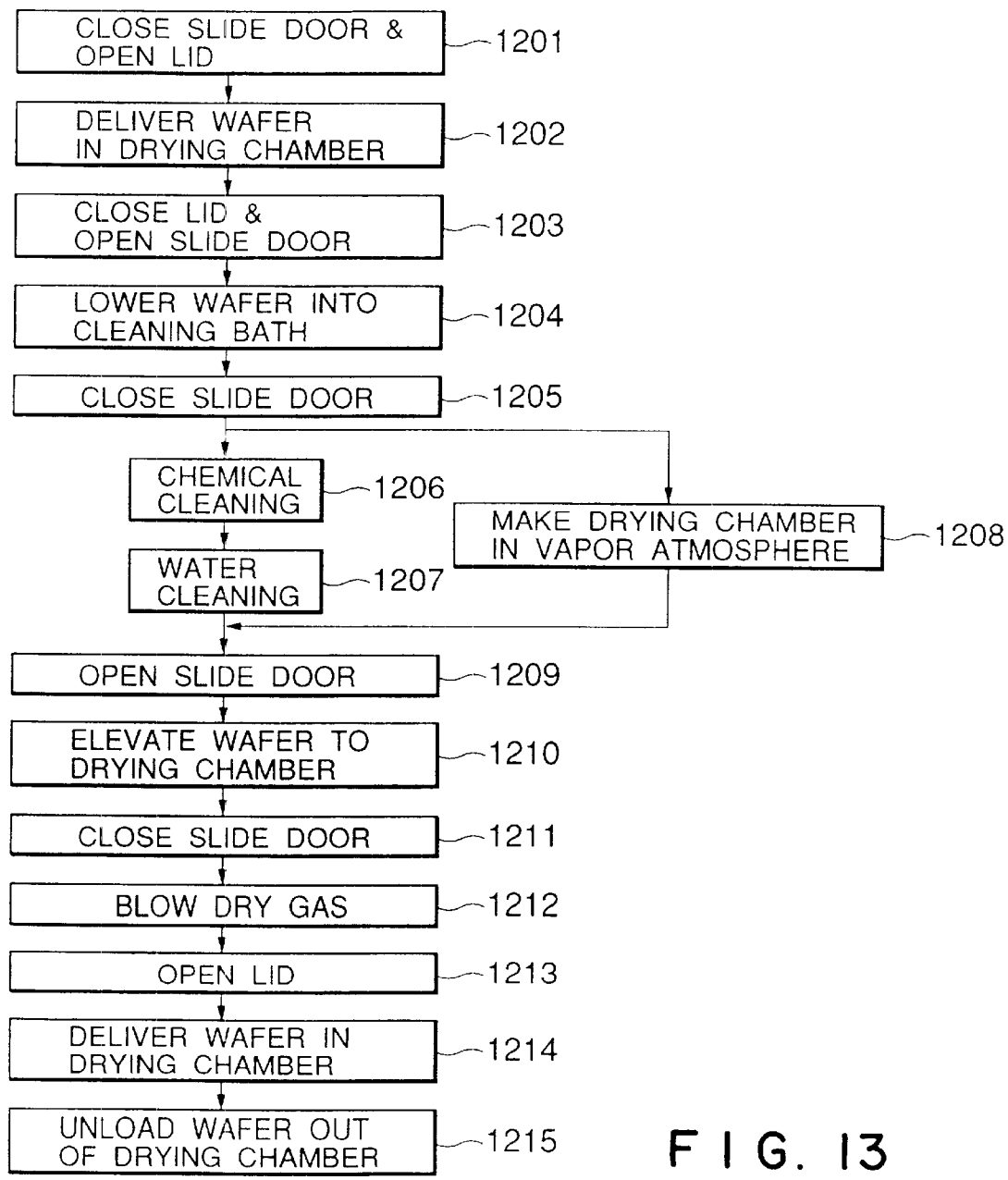
FIG. 13 is a flow chart of an operation of the cleaning unit of FIG. 4.

We now describe an operation of the cleaning apparatus 27 constructed above, in accordance with a flow chart of FIG. 13. Note, the following operational control is executed by a not-shown controller.

Figure 14:
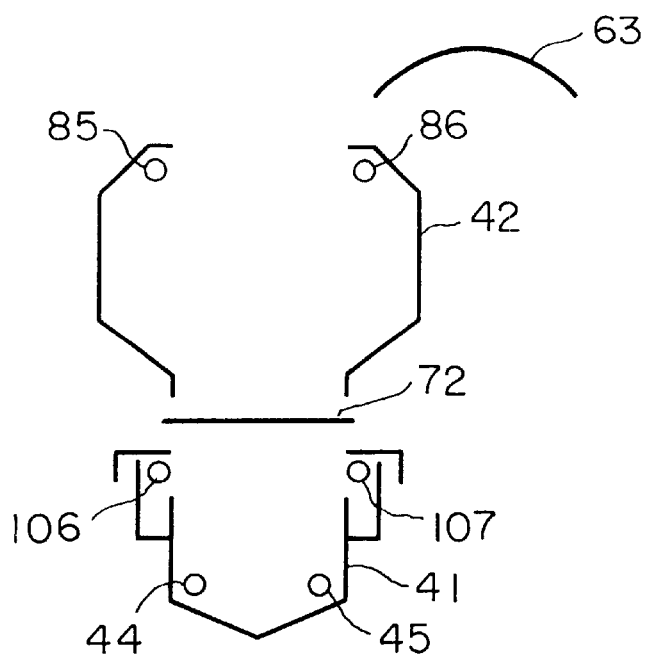
FIG. 14 is a schematic view showing the operation of the cleaning unit of FIG. 4, corresponding to a step 1201 of FIG. 13.
Figure 15:
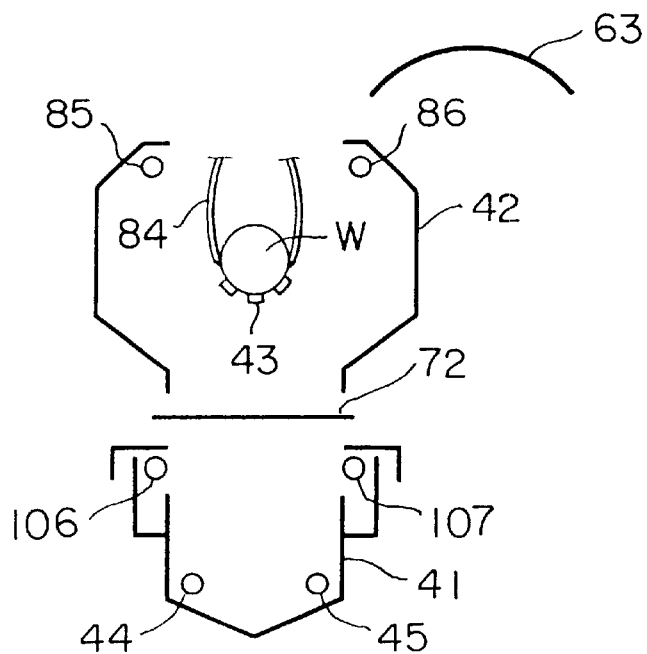
FIG. 15 is a schematic view showing the operation of the cleaning unit of FIG. 4, corresponding to a step 1202 of FIG. 13.

First of all, upon closing the slide door 72 at the bottom of the drying chamber 42, the lid 63 on the top of the chamber 42 is opened (see step 1201, FIG. 14). Next, the wafer chuck 84 is lowered into the chamber 42, while the wafers W are delivered to the wafer guide 43 in the chamber 42 (see step 1202, FIG. 15).

At sequent step 1203, it is executed to close the lid 63 on the top of the chamber 42 and open the slide door 72 at the bottom of the chamber 42 (see FIG. 16). Then, the wafer guide 43 carrying the wafers W is lowered to transfer them into the cleaning bath 41 (step 1204, FIG. 17) and the slide door 72 is closed in succession (step 1205, FIG. 18).

Thereafter, in the cleaning bath 41, it is executed to inject the mixture of $HF/H_2O$ through the nozzles 44, 45 and subsequently immerse the wafers W into the reserved mixture of $HF/H_2O$ for chemical cleaning (step 1206, FIG. 19). Of course, this chemical liquid may be stored prior to the introduction of the wafers W into the cleaning bath 41. As a matter of course, the mixture of $HF/H_2O$ ejected from the nozzles 44, 45 forms a convection directing the wafers W in the cleaning bath 41 thereby to promote the chemical cleaning. Next, the mixture of $HF/H_2O$ is discharged and thereafter, the DIW is ejected from the nozzles 44, 45 to rinse the wafers W (step 1207, FIG. 19). As well as the mixture of $HF/H_2O$, the DIW ejected from the nozzles 44, 45 forms a convection directing the wafers W in the cleaning bath 41 thereby to promote the rinsing process. Note, in the modification, the supply of DIW may be started without discharging the mixture of $HF/H_2O$ so that the density of the mixture becomes to be thin gradually. On the other hand, while such a cleaning process is carried out, the IPA is blown out from the nozzles 85, 86, so that the drying chamber 42 is filled up with an atmosphere of the IPA in advance (step 1208, FIG. 19).

Next, at step 1209, it is executed to open the slide door 72 at the bottom of the drying chamber 42 (FIG. 20) and thereafter, the wafer guide 43 carrying the wafers W is elevated to transport them into the drying chamber 42 (step 1210, FIG. 21). During the transportation, the nitrogen gas or the mixed gas composed of nitrogen gas and IPA is blown against the wafers W on transportation from the cleaning bath 41 to the drying chamber 42 by the nozzles 106, 107. Subsequently, upon closing the slide door 72 at the bottom of the drying chamber 42 (step 1211, FIG. 22), the nitrogen gas or the mixed gas composed of nitrogen gas and IPA is blown from the nozzles 85, 86 to the wafers W in the drying chamber 42 in the downward flowing manner (step 1212, FIG. 23). Note, in the modification, the drying chamber 43 may be constructed in a manner that the nitrogen gas is blown against the wafers W downwardly from the nozzles 85, 86 before closing the slide door 72.

Figure 24:
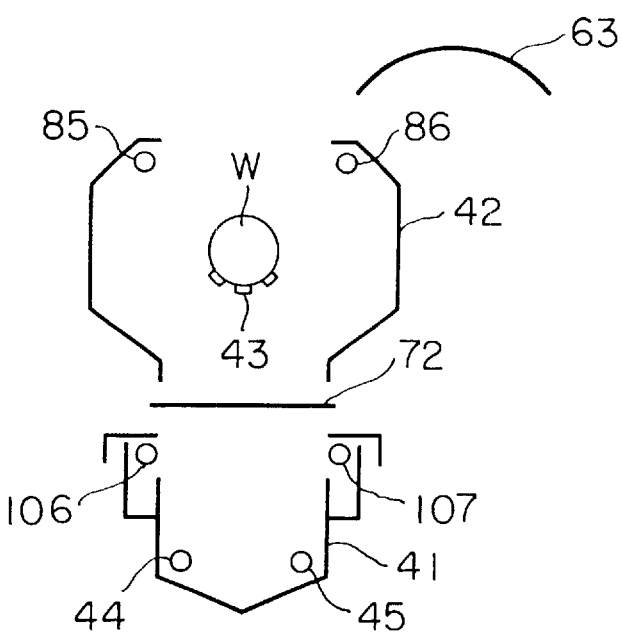
FIG. 24 is a schematic view showing the operation of the cleaning unit of FIG. 4, corresponding to a step 1213 of FIG. 13.
Figure 25:
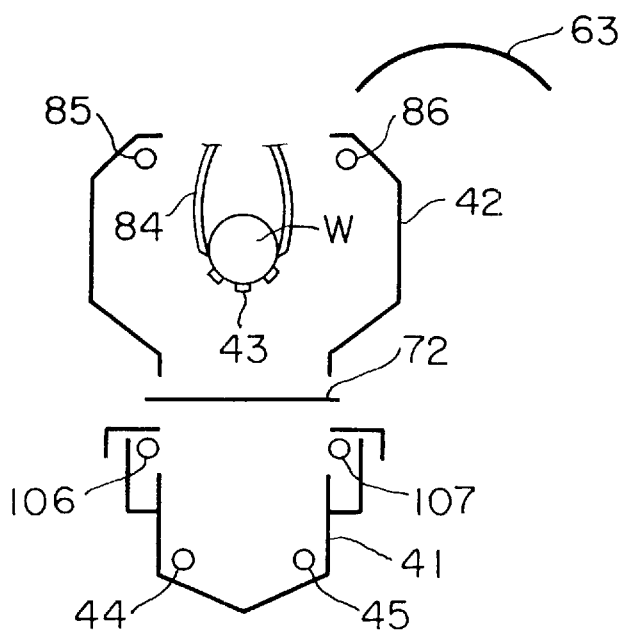
FIG. 25 is a schematic view showing the operation of the cleaning unit of FIG. 4, corresponding to a step 1214 of FIG. 13.
Figure 26:
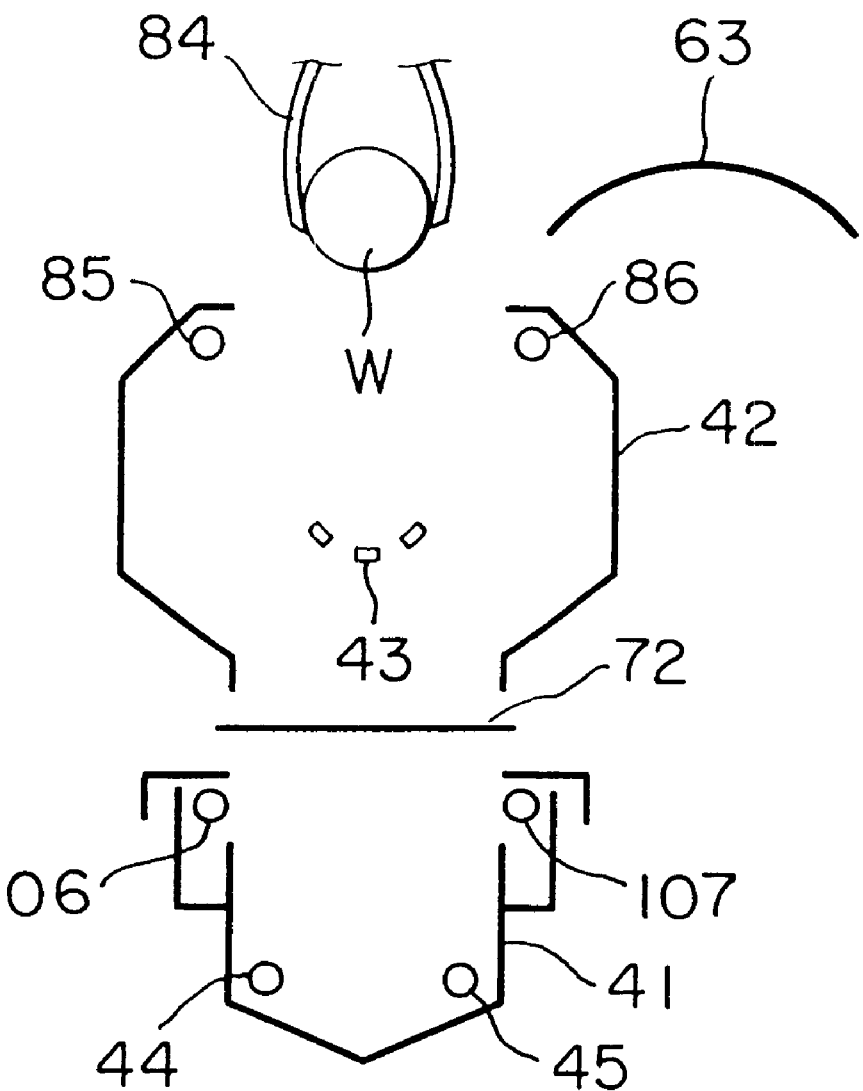
FIG. 26 is a schematic view showing the operation of the cleaning unit of FIG. 4, corresponding to a step 1215 of FIG. 13.

At sequent step 1213 (FIG. 24), it is executed to open the lid 63 on the top of the drying chamber 42 and thereafter, the wafer chuck 84 is lowered into the chamber 42 to receive the wafers W from the wafer guide 43 (step 1214, FIG. 25). Then, the wafer chuck 84 is elevated to unload the wafers W to the outside of the drying chamber 42(step 1215, FIG. 26).

In this way, according to the cleaning apparatus 27 of the embodiment, since the drying chamber 42 and the cleaning bath 41 are separated from each other up and down and constructed so that the former space can be insulated from the latter space by the slide door 72 and the respective processes are carried out separately by the closing slide door 72, there is no possibility that the drying chamber 42 and the cleaning bath 41 mutually exert a bad influence due to the chemical and so on. In addition, since the arrangement allows the drying chamber 42 and the cleaning bath 41 to be designed under respective conditions independent of each other, it is possible to optimize the cleaning process and further miniaturize the cleaning apparatus 27 because of the enhanced degree of freedom in the process design. For instance, in order to finish off the drying process quickly, the drying chamber 42 may be provided with the panel heaters 103, 104 for heating the interior of the chamber 42. Or again, the atmosphere in the drying chamber 42 may be replaced with the IPA while cleaning the wafers W in the cleaning bath 41 in view of the prompt drying process.

Further, since the drying chamber 42 can be miniaturized in comparison with that of the conventional cleaning apparatus where the processing bath and the drying chamber have been accommodated in one chamber, it is possible to carry out the drying process more effectively. Furthermore, since in the drying process, the apparatus is constructed so that nitrogen gas is ejected against the wafer W to blow away the rest of processing liquid on the surface of the wafer W, it is possible to do the drying process efficiently.

Now, it is noted that the present invention is not limited to the above-mentioned embodiment and various changes and modifications may be made within a scope of concept of the art.

For example, although the nitrogen gas is used as the inert gas of the above-mentioned embodiment, other inert gases, such as argon (Ar), helium (He) etc., may be used as a substitute of the nitrogen gas. It is obvious that the heating of these inert gases allows the drying process to be carried out more effectively. While, needless to say, they do not have to be heated.

Although the IPA is employed as a water-soluble organic solvent having an function to decrease the surface tension of pure water with respect to the object to be processed in the embodiment, the IPA may be replaced with other organic solvents, for example, ketonic kinds (e.g. diethyl keton), ether kinds (e.g. methyl ether, ethyl ether), multicharged alcohol (e.g. ethylene glycol) or the like.

Although the chemical treatment using the mixture of $HF/H_2O$, the rinsing process using the pure water and drying process are executed in the cleaning apparatus 27 in the above-mentioned embodiment, it should be understood that a cleaning apparatus for and a method of executing at least the drying process and one or more other processes will be included in the scope of the invention. For example, the chemical process using the mixture of $HF/H_2O$, the rinsing process using the pure water, the chemical process using the mixture of $NH_4OH/H_2O_2/H_2O$, and the chemical process using the mixture of $HCl/H_2O_2/H_2O$ etc. are applicable to the above other processes. Accordingly, of course, the cleaning apparatus of the invention may be constructed so as to carry out, for example, the chemical process using the mixture of $NH_4OH/H_2O_2/H_2O$, the chemical process using the mixture of $HCl/H_2O_2/H_2O$, the chemical process using the mixture of $HF/H_2O$, the rinsing process using the pure water, and the drying process.

Although the above-mentioned embodiment is one example of the cleaning apparatus of the invention in association with a cleaning equipment having the processing baths in processing order, it is possible to use the present cleaning apparatus as a stand alone type apparatus. In this case, for example, it is also possible to construct the stand alone apparatus by connecting a transfer section having the loader part and unloader part with the present cleaning apparatus.

In addition, it will be understood that the object to be processed is not limited to the semi-conductor wafer of the embodiment, so that a LCD substrate, a glass substrate, a CD substrate, a photomask, a print substrate, a ceramic substrate or the like is applicable to the object to be processed by the present apparatus and method.

As mentioned above, according to the cleaning apparatus of the present invention, since it includes the processing bath for storing the processing liquid in which the object is immersed; the drying chamber arranged above the processing bath and provided with the opening which is disposed between the body of the drying chamber and the processing bath and through which the object is transported, the opening being capable of closing; the transporting means for transporting the object between the processing bath and the drying chamber through the opening; and the first blowing means arranged in the drying chamber, for blowing the gas containing the inert gas against the object, the object has no possibility to receive a bad influence from the chemical treatment during the drying process. In addition, with the enhanced degree of freedom in the design, it is possible to increase a speed of the cleaning process and further miniaturize the cleaning apparatus, whereby the drying process can be executed more effectively.

Further, according to the cleaning method of the present invention, since. it includes the steps of (a) immersing the object into the processing bath for storing the processing liquid; (b) transporting the object from the processing bath to the drying chamber arranged above the processing bath through the opening which is capable of opening and closing; (c) closing the opening after the object has been transported to the drying chamber; and (d) blowing the gas containing the inert gas against the object, the object has no possibility to receive the bad influence from the chemical treatment during the drying process. Further, owing to the enhanced degree of freedom in the design, it is possible to increase a speed of the cleaning process and further miniaturize the cleaning apparatus, whereby the drying process can be executed more effectively, too.

Further, according to the other cleaning method of the present invention, since it includes the steps of (a) immersing the object into the processing bath for storing processing liquid; (b) transporting the object from the processing bath to the drying chamber arranged above the processing bath through an opening which is capable of opening and closing; (c) blowing the gas containing the inert gas against the object; and (d) closing the opening after the object has been transported to the drying chamber, the object has no possibility to receive the bad influence from the chemical treatment during the drying process. Further, also in this case, owing to the enhanced degree of freedom in the design, it is possible to increase a speed of the cleaning process and further miniaturize the cleaning apparatus, whereby the drying process can be executed more effectively, too.

What is claimed is:

1. A cleaning apparatus for cleaning an object to be processed, said apparatus comprising:
   a cleaning bath for storing cleaning liquid, the object being immersed in said cleaning liquid, said cleaning bath having an upper portion defining an upper opening;

a drying chamber for drying the object, said drying chamber being enclosed by a case arranged above said cleaning bath, said case having a lower portion defining a lower opening, said lower opening being in opposition to and being connected with said upper opening between said case of said drying chamber and said cleaning bath;

a transporter for transporting the object between said cleaning bath and said drying chamber through said upper opening and said lower opening;

a first blowing nozzle arranged in said drying chamber, for blowing gas containing inert gas against the object in order to dry the object;

discharging ports, for discharging gas blown out from said first blowing nozzle, said discharging ports being in said drying chamber and being arranged on both sides of said drying chamber in a lower position than said first blowing nozzle; and a rectifier for communicating with said exhaust port and having a plurality of intake ports for introducing gas which has been blown out from said first blowing nozzle, through a lower section of said drying chamber.

2. A cleaning apparatus as claimed in claim 1, further comprising:

a door for opening and shutting said lower opening, said lower opening being closed when the object is dried, wherein said upper opening is positioned below and separated from said lower opening, and said door is located under said lower opening of said case of said drying chamber and above said upper opening of said processing bath.

3. A cleaning apparatus as claimed in claim 1, wherein said case has an upper portion defining an upper aperture, and a cover arranged on said upper aperture in order to open and close said upper aperture, said cover being controlled so that said cover is opened when said door is closed.

4. A cleaning apparatus as claimed in claim 1, wherein second blowing nozzle is located above and close to a surface of said cleaning liquid in said cleaning bath.

5. A cleaning apparatus as claimed in claim 1, further comprising ejecting nozzles arranged at a lower portion of said cleaning bath for ejecting cleaning liquid for the objects, said ejecting nozzle having a plurality of outlets for ejecting the cleaning liquid into said cleaning bath, said outlets being located along said ejecting nozzle at same intervals as that of said objects to be cleaned.

6. A cleaning apparatus as claimed in claim 1, further comprising a heater arranged on a side of said drying chamber, for heating the object.

7. A cleaning apparatus as claimed in claim 1, wherein said cleaning liquid stored in said cleaning bath is a deaerated rinse.

8. A cleaning apparatus as claimed in claim 1, wherein said case has an upper portion defining an upper aperture and cover arranged on said upper aperture in order to open and close said upper aperture, said drying chamber is enclosed by said case including the cover, and said drying chamber formed in a substantially cylindrical shape.

9. A cleaning apparatus as claimed in claim 1, wherein said first blowing nozzle includes a nozzle pipe extending in an arranging direction of the object, said nozzle pipe has a plurality of outlets for ejecting gas into said drying chamber, said outlets being located along said nozzle pipe at regular intervals each of which is identical to the distance between the adjoining objects in the direction of the objects' arrangement.

10. A cleaning apparatus as claimed in claim 9, wherein the object includes a wafer.

11. A cleaning apparatus as claimed in claim 1, further comprising:

a second blowing nozzle arranged between said cleaning bath and said drying chamber, for blowing said gas containing said inert gas against the object transported from said cleaning bath to said drying chamber.

12. A cleaning apparatus as claimed in claim 11, wherein said inert gas is heated inert gas.

13. A cleaning apparatus as claimed in claim 11, wherein said inert gas is nitrogen gas.

14. A cleaning apparatus as claimed in claim 13, wherein said gas containing said inert gas is a mixed gas composed of an organic solvent and inert gas.

15. A cleaning apparatus as claimed in claim 13, wherein said gas containing said inert gas is a mixed gas composed of an organic solvent and heated inert gas.

* * * * *